United States Patent
Nomura

(10) Patent No.: US 7,109,814 B2
(45) Date of Patent: Sep. 19, 2006

(54) PIEZOELECTRIC OSCILLATOR

(75) Inventor: Norio Nomura, Kouza-gun (JP)

(73) Assignee: Toyo Communication Equipment Co., Ltd., Kanagawa (JP)

( * ) Notice: Subject to any disclaimer, the term of this patent is extended or adjusted under 35 U.S.C. 154(b) by 0 days.

(21) Appl. No.: 10/931,763

(22) Filed: Sep. 1, 2004

(65) Prior Publication Data

US 2005/0052253 A1    Mar. 10, 2005

(30) Foreign Application Priority Data

Sep. 5, 2003    (JP) .............................. 2003-314761

(51) Int. Cl.
  *H03B 5/32*    (2006.01)
(52) U.S. Cl. .............. 331/158; 331/116 R; 331/116 FE
(58) Field of Classification Search ............ 331/116 R, 331/158, 116 FE
  See application file for complete search history.

(56) References Cited

U.S. PATENT DOCUMENTS 6,717,482 B1 *    4/2004    Sato et al. .................. 331/154

OTHER PUBLICATIONS

"Transistor Crystal Oscillators," pp. 771-777, written by Yasutomo Miyake, and published in Japan by Institute of Electronics and Communication Engineers of Japan in Jun. 1970.
"Quartz Resonators and Devices," pp. 667-682, written by Hirofumi Kawashima, Koichi Hirama, Naoya Saitou and Mitsuaki Koyama, and published in Japan by Institute of Electronics and Communication Engineers of Japan in Dec. 1999.
"Study on Measurement of Phase Noise in High Precision Oscillator Using PLL Type Frequency Multiplier," pp. 486-492, written by Yukinori Sakuta, Hideki Mino and Yoshifumi Sekine, and published in Japan by Institute of Electronics and Communication Engineers of Japan in Sep. 1999.
"New Crystal Oscillator Suppressing CI Dip and Frequency Jump," pp. 249-259, written by Heihachi Shimono, and published in Japan by Institute of Electronics and Communication Engineers of Japan in Apr. 2002.

* cited by examiner

Primary Examiner—Arnold Kinkead
(74) Attorney, Agent, or Firm—Koda & Androlia

(57) ABSTRACT

In a Colpitts quartz oscillation circuit, large negative resistance values are obtained in a high frequency band, and in the GHz band in particular. In a piezoelectric oscillator having a Colpitts oscillator, a voltage control circuit, and a coupling capacitor that couples the Colpitts oscillator and the voltage control circuit, an output of the voltage control circuit is feed back to a collector of the Colpitts oscillator via the coupling capacitor.

2 Claims, 5 Drawing Sheets

PIEZOELECTRIC OSCILLATOR

BACKGROUND OFF THE INVENTION

1. Field of the Invention

The present invention relates to a piezoelectric oscillator, and in particular, to a piezoelectric oscillator which obtains large negative resistances in a high frequency range.

2. Background Art

In recent years, accompanying the developments in wireless communication, there is a demand to make oscillators higher in frequency and more compact. Generally, quartz vibrators have excellent frequency stability, and currently are used over a wide range such as in communication equipment and computers. Usually, Colpitts oscillators, which are structured such that an inductive element is connected between the collector and the base, and a capacitive element is connected between the base and the emitter, and between the collector and the emitter, respectively, are often used as quartz oscillation circuits. FIG. 9 is a basic Colpitts oscillator using a bipolar transistor. As the inductive element between the collector and the base of a transistor Tr1, a series-connected element of a quartz vibrator X and a capacitor Cv (Cv is used for fine tuning the oscillation frequency) is used between the base and the ground. Further, a series-connected element of capacitors C1 and C2 is connected between the base and the ground, and a resistor Re is inserted between the emitter and the earth, and the emitter and the midpoint of the capacitors C1 and C2 are connected.

In the Colpitts oscillator of FIG. 9, a power source Vcc is grounded in a high frequency manner by a bypass capacitor C3. Thus, an inductive element caused by the quartz vibrator X is inserted between the collector and the base of the transistor Tr1 in an equivalent circuit manner. Further, since the midpoint of the capacitors C1 and C2 is connected to the emitter of the transistor Tr1, the capacitor C1 is inserted between the base and the emitter of the transistor Tr1, and the capacitor C2 is inserted between the collector and the emitter of the transistor Tr1, and both capacitors are used as capacitive elements.

Here, the reason for using a quartz vibrator as an inductive element is that an oscillation circuit whose frequency is stable can easily be structured because the Q value is large, the ratio of changes in the equivalent inductance with respect to frequency changes is large, and frequency control is easy.

It is known that, in a Colpitts oscillator, generally, the amplification degree viewing the circuit side from the both ends of the quartz vibrator X (the quartz vibrator and the capacitor Cv in the case of FIG. 9), i.e., the so-called negative resistance R ($\Omega$), is inversely proportional to the capacitors C1 and C2 and the square of the frequency $\omega^2$, and is proportional to the collector current. Namely, as shown by the simulated results of FIG. 10, together with the frequency becoming higher, the absolute value of the negative resistance R($\Omega$) increases, and reaches a peak value at a predetermined frequency, and thereafter, decreases as the frequency becomes higher. In a usual Colpitts quartz vibrator, the negative resistance R at the oscillation frequency is generally set to about 3 to 5 times the equivalent resistance of the quartz vibrator, and is set such that the negative resistance value is large at the desired oscillation frequency.

The problem to be solved by the invention is that, in a general Colpitts quartz oscillation circuit such as shown in FIG. 10, it is difficult to obtain a negative resistance value in the high frequency band, and in the GHz band in particular. Accordingly, it is difficult to address the demands to make oscillators, which are clock frequency sources, be higher in frequency, which demands accompany the improvement in transmission speeds of information communication infrastructures which will become more important from here on.

SUMMARY OF THE INVENTION

In order to solve the above problems, a first aspect of the present invention provides a piezoelectric oscillator having a Colpitts oscillator using a bipolar transistor, a voltage control circuit, and a coupling capacitor which couples the Colpitts oscillator and the voltage control circuit, wherein an output of the voltage control circuit is fed back to a collector of the Colpitts oscillator via the coupling capacitor.

A second aspect of the present invention provides the piezoelectric oscillator according to the first aspect, wherein the voltage control circuit is an emitter follower circuit.

A third aspect of the present invention provides the piezoelectric oscillator according to the first or the second aspect, wherein large negative resistances in the GHz band are obtained by a phase shift by the coupling capacitor and a capacitor between a base and a collector of the Colpitts oscillator.

DETAILED DESCRIPTION OF THE PREFERRED EMBODIMENTS

Figure 1:
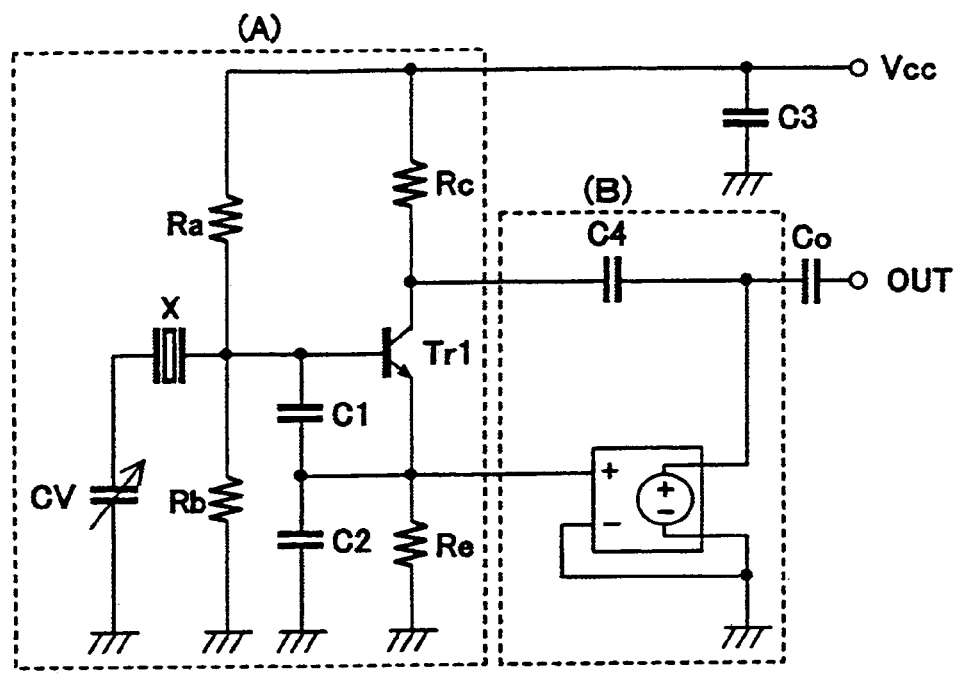
FIG. 1 is a diagram showing an expanded Colpitts oscillator according to the present invention.

FIG. 1 is a diagram showing the structure of a Colpitts oscillator according to the present invention (hereinafter called an expanded Colpitts oscillator), and is structured by a Colpitts quartz oscillation circuit using a bipolar transistor within the dashed line indicated by (A), and a voltage source circuit for voltage control (hereinafter referred to as "voltage control circuit") within the dashed line indicated by (B). The circuit indicated by (A) is the same as the circuit shown in FIG. 9, and the operation thereof has already been described. Therefore, the operation of the circuit indicated by (A) is omitted. An operation of the voltage control circuit indicated by (B) is explained below. The voltage control circuit supplies alternating current without DC component to the collector of Tr1 via a coupling capacitor C4.

Figure 2:
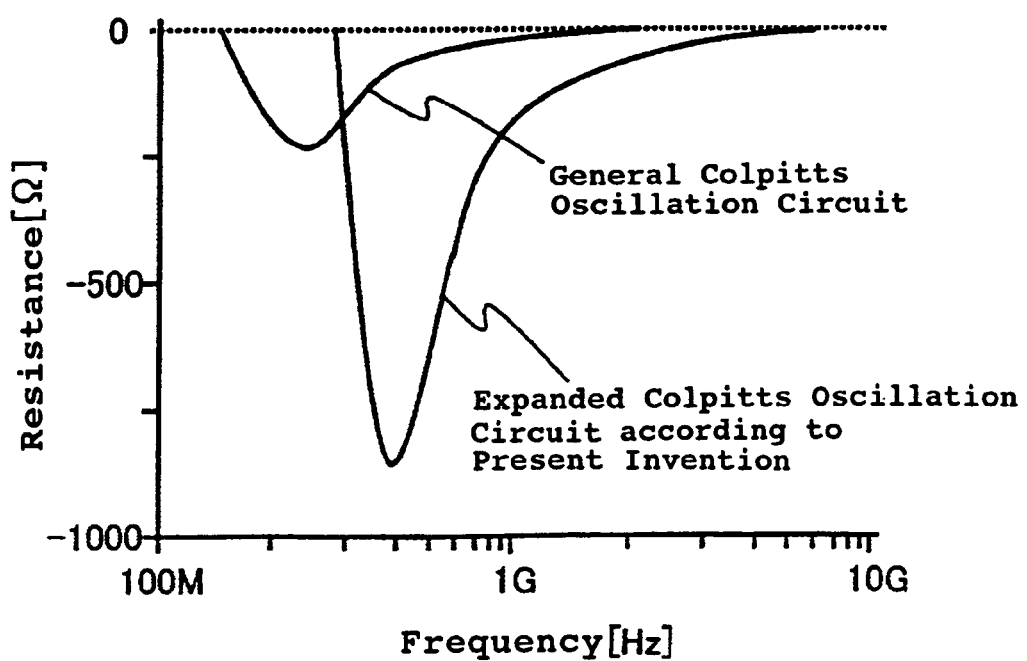
FIG. 2 is a graph showing negative resistance characteristic curves of a conventional Colpitts oscillator and the expanded Colpitts oscillator according to the present invention.

An example of results of simulating the negative resistance characteristic of the expanded Colpitts oscillator according to the present invention is shown in FIG. 2. As is clear from FIG. 2, as compared with a general Colpitts oscillator, the expanded Colpitts oscillator of the present invention can obtain, in the high frequency band, larger negative resistance values than the conventional one. Namely, the peak of the conventional negative resistance value is near 200 MHz, whereas the peak shifts to 400 to 500 MHz, and the absolute value thereof also becomes large. In particular, there is the feature that, even at several GHz, negative resistances that are large enough for oscillation operation can be obtained. Results of studying this principle will be described hereinafter.

Figure 3:
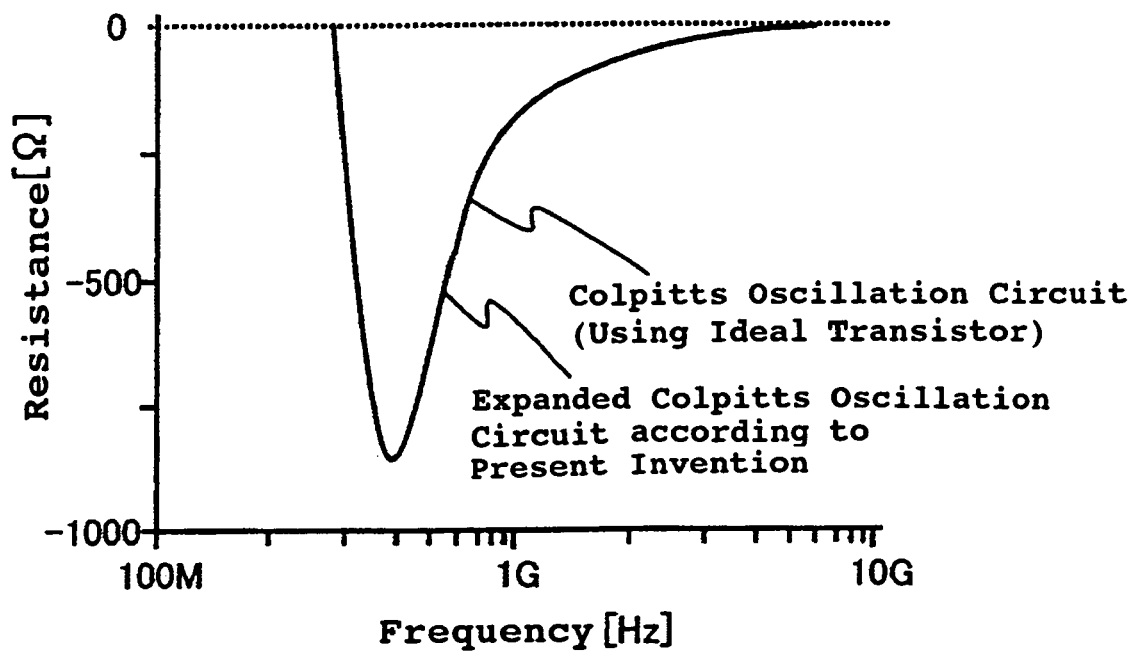
FIG. 3 is a graph showing negative resistance characteristic curves of a conventional Colpitts oscillator using an ideal transistor and the expanded Colpitts oscillator according to the present invention.

FIG. 3 shows the results of simulation of negative resistance characteristic curves of the expanded Colpitts oscillator according to the present invention, and a conventional Colpitts oscillator in a case in which the internal capacity of the transistor Tr1 is not considered and is made to be an ideal transistor. It is shown in FIG. 3 that, when an ideal transistor is used, the negative resistance characteristic curves of the conventional Colpitts oscillator and the expanded Colpitts oscillator according to the present invention are equivalent. These results show that the reason why the Colpitts oscillator does not obtain large negative resistance values in the high frequency range is due to the internal capacitance of the transistor.

Figure 9:
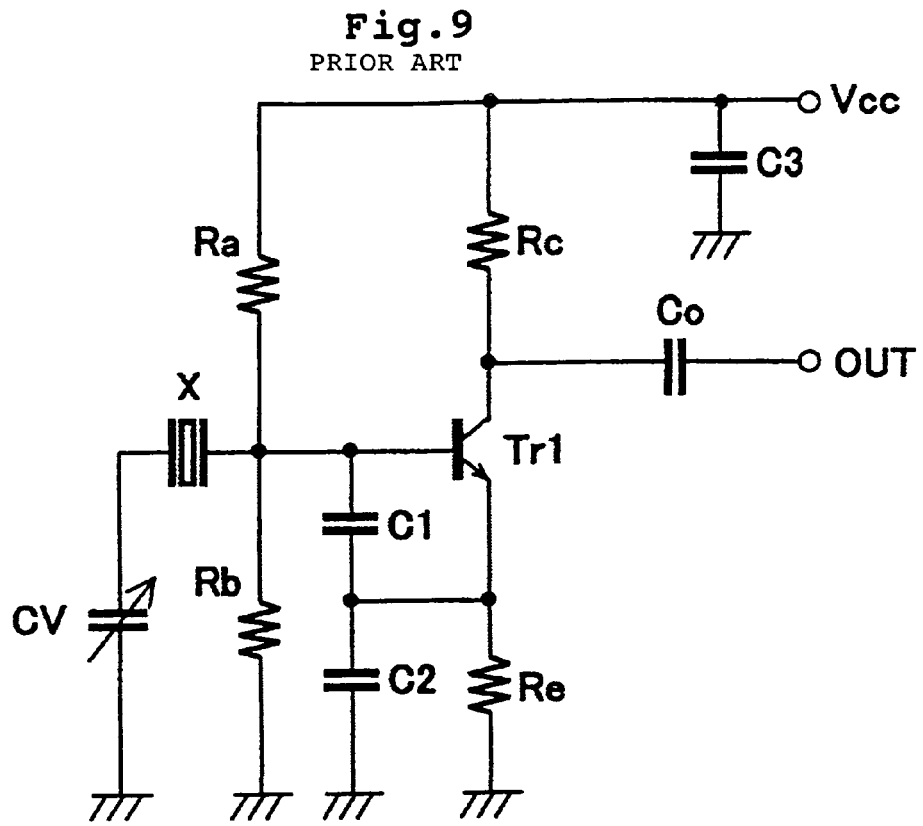
FIG. 9 is a diagram showing a conventional Colpitts oscillator.
Figure 10:
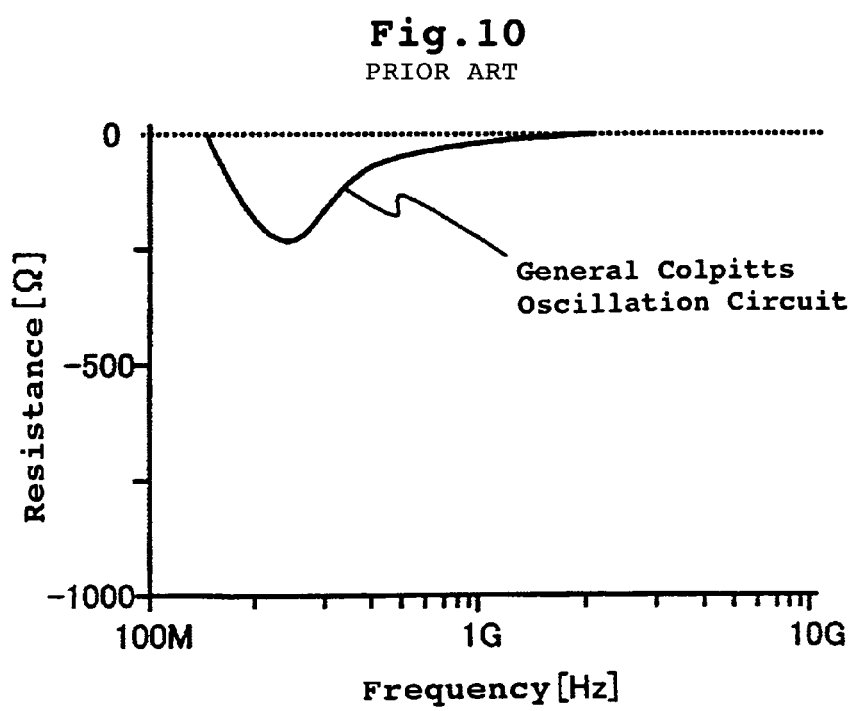
FIG. 10 is a graph showing a negative resistance characteristic curve of the conventional Colpitts oscillator.

Thus, studies on the internal capacitance of the transistor are carried out. In FIG. 9 showing the conventional Colpitts oscillator, the capacitance between the base and the emitter of the transistor Tr1 contributes the combined capacitance accompanied with the capacitor C1 in FIG. 9, and a fluctuation of the combined capacitance is equivalent to that of the capacitor C1. Thus, here, studies and simulations are carried out on the capacitance between the collector and the emitter of Tr1, and on the capacitance between the base and the collector of Tr1.

Figure 4:
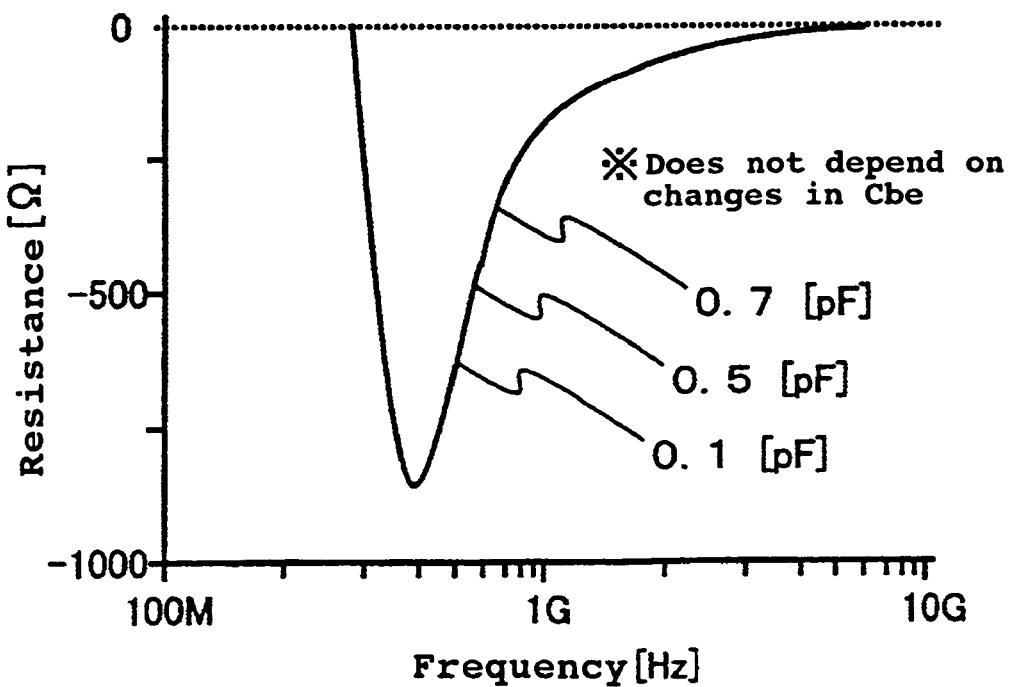
FIG. 4 is a graph showing a negative resistance characteristic curve of a conventional Colpitts oscillator which considers only the capacity between the collector and the emitter.

FIG. 4 shows the results of simulation of the negative resistance characteristic curves when only the capacitance between the collector and the emitter of the transistor Tr1 in the circuit of FIG. 9 is considered and is varied to 0.7 pF, 0.5 pF, and 0.1 pF. This result shows that, even if the capacitance between the collector and the emitter varies, the obtained negative resistance value hardly changes at all.

Figure 5:
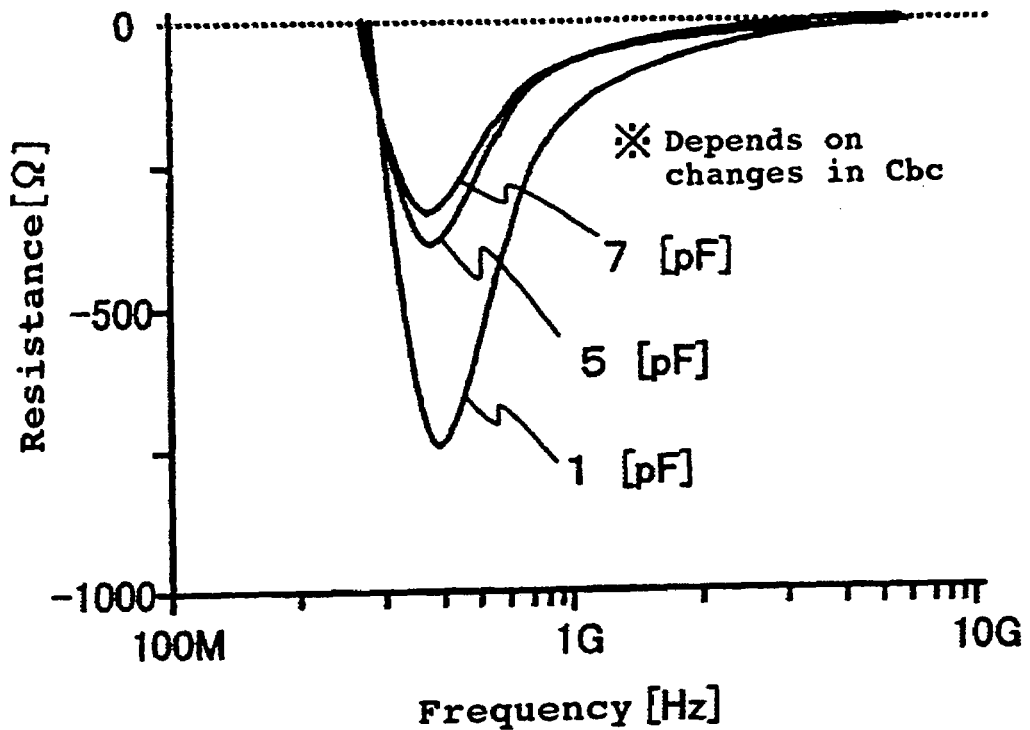
FIG. 5 is a graph showing negative resistance characteristic curves of a conventional Colpitts oscillator which considers only the capacity between the base and the collector.

Further, FIG. 5 shows the results of simulation of the negative resistance characteristic curves when only the capacitance between the base and the collector of the transistor Tr1 in the circuit of FIG. 9 is considered and is varied to 7 pF, 5 pF, and 1 pF. FIG. 5 shows that the obtained negative resistance value becomes greater by decreasing the capacitance between the base and the collector of Tr1. Accordingly, it can be understood that the expanded Colpitts oscillator according to the present invention is attributable to changes in the capacity between the base and the collector.

Figure 6:
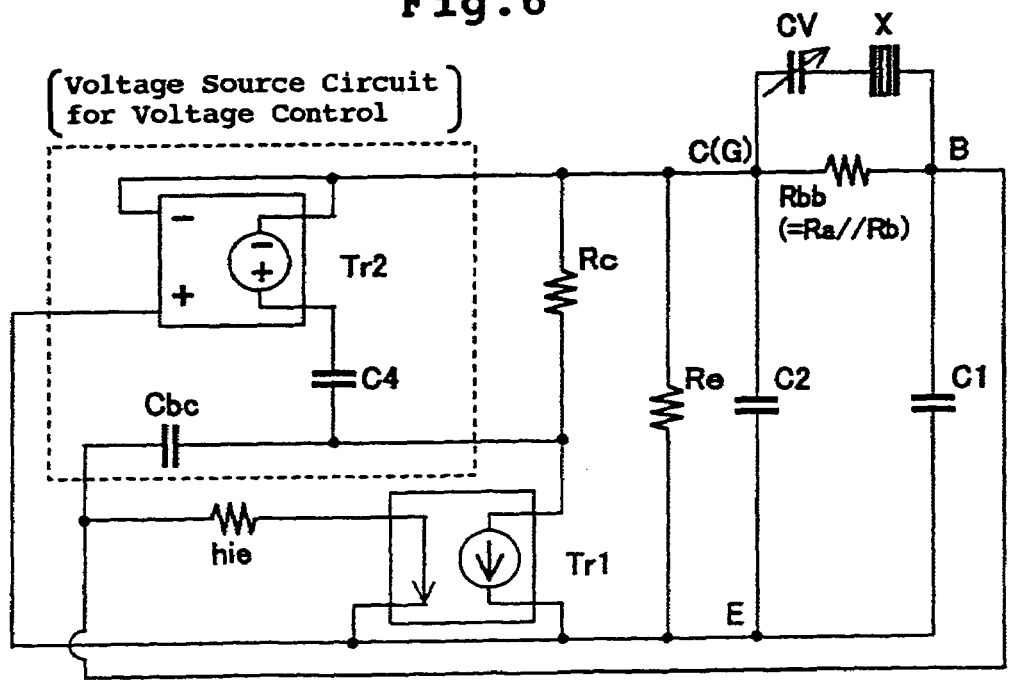
FIG. 6 is a diagram showing a circuit structure at the time of a small signal of the expanded Colpitts oscillator according to the present invention.

FIG. 6 is an equivalent circuit with the voltage control circuit shown in FIG. 1(B) and the Colpitts oscillator in FIG. 1(A) at small signal. Here, Rbb in FIG. 6 denotes the equivalent resistance of the parallel connection of Ra, Rb in FIG. 1. Further, an input impedance hie of Tr1 is added between the base and the emitter Tr1, and a capacitor Cbc between the base and the collector of Tr1 is added between the base and the emitter, respectively.

Figure 7:
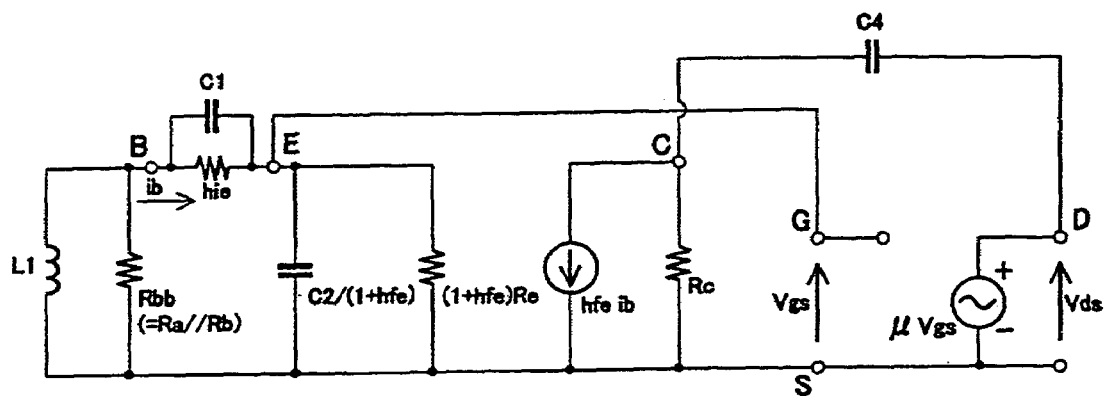
FIG. 7 is a diagram showing an example of a small signal equivalent circuit of the expanded Colpitts oscillator according to the present invention.

Further, FIG. 7 is a diagram showing a small signal equivalent circuit in a case in which a source ground FET amplification circuit is used at the voltage control voltage source of the circuit of FIG. 6.

Here, it is confirmed by simulation that, even if parameters such as the values of the respective bias resistances or a current amplification rate hfe of the transistor Tr1 is varied, the frequency band of the obtained negative resistance value does not change.

Further, as is clear from FIG. 3, the negative resistance values of the expanded Colpitts oscillator proposed herein and the conventional Colpitts oscillator are equivalent if the internal capacity of the transistor are not considered. Therefore, it is understood that the reason why large negative resistance values are obtained in the GHz band by the expanded Colpitts oscillator lies in the phase shift of the coupling capacitor C4 and the capacitor Cbc between the base and the collector in FIG. 6.

Figure 8:
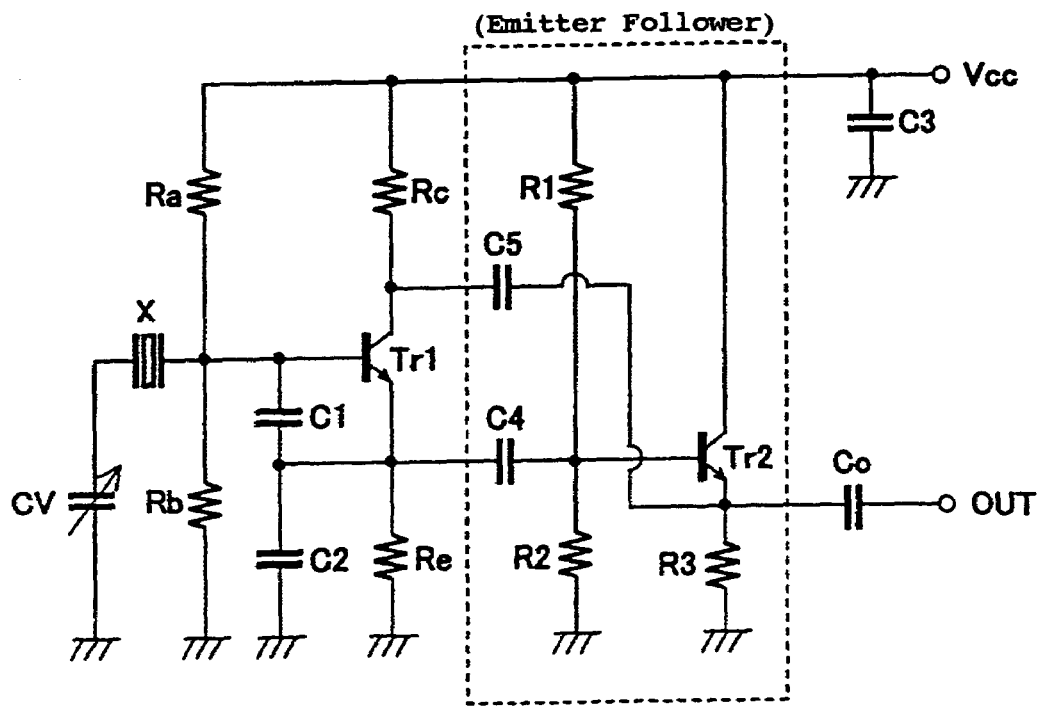
FIG. 8 is a diagram showing an embodiment of the expanded Colpitts oscillator according to the present invention.

FIG. 8 is a diagram utilizing the principles of the expanded Colpitts oscillator proposed herein, and using an emitter follower as a voltage source for a voltage control.

In this circuit structure, the bias is set by resistors R1, R2, and R3, and the emitter of the transistor Tr1, which is the output of the conventional Colpitts oscillator, is joined, via coupling capacitor C4, to the base which is the input of a transistor Tr2 which structures the emitter follower. Further, the emitter, which is the output of the transistor Tr2, is joined, via a coupling capacitor C5, to the collector of the transistor Tr1, and feeds-back.

In this circuit structure, when simulation is carried out in accordance with the following parameters, it is confirmed that, as shown in FIG. 2, large negative resistance values in the GHz band are obtained as compared with the conventional Colpitts oscillator.

C1=7 pF, C2=5 pF, C3=270 pF, C4=270 pF, Ra=3.3 kΩ, Rb=12 kΩ, Rc=82 Ω, Re=220 Ω, R1=2.2 kΩ, R2=15 kΩ, R3=1 kΩ, Vcc=5 V.

The above description is an example of applying the present invention to a Colpitts oscillator structured by using a fundamental wave. However, the present invention is not limited to the same, and can be applied to a Colpitts oscillator structured by using a third-order harmonic quartz vibrator or a fifth-order harmonic quartz vibrator. Further, the embodiments are examples of using a source ground amplification circuit and an emitter follower as the voltage control voltage source, but the present invention is not limited to the same.

The Colpitts oscillator of the present invention is structured such that the output of a voltage control circuit is fed back to the collector of a Colpitts oscillator via a coupling capacitor, and has the advantage that, due to the phase shift at the time of the coupling capacitor and the capacitor between the base and the collector, large negative resistances are obtained even in the GHz band.

What is claimed is:

1. A piezoelectric oscillator having a Colpitts oscillator using a bipolar transistor, a voltage control circuit, and a coupling capacitor that couples the Colpitts oscillator and the voltage control circuit, wherein an output of the voltage control circuit is fed back to a collector of the Colpitts oscillator via the coupling capacitor and the voltage control circuit is an emitter follower circuit.

2. The piezoelectric oscillator according to claim 1, wherein large negative resistances in the GHz band are obtained by a phase shift by the coupling capacitor and a capacitor between a base and a collector of the Colpitts oscillator.

* * * * *